United States Patent
Huang et al.

(10) Patent No.: US 9,666,511 B2
(45) Date of Patent: May 30, 2017

(54) ISOLATION METHOD FOR A STAND ALONE HIGH VOLTAGE LATERALLY-DIFFUSED METAL-OXIDE SEMICONDUCTOR (LDMOS) TRANSISTOR

(71) Applicant: Taiwan Semiconductor Manufacturing Co., Ltd., Hsin-Chu (TW)

(72) Inventors: Tzu-Ming Huang, New Taipei (TW); Shen-Ping Wang, Keelung (TW); Lieh-Chuan Chen, Hsinchu (TW); Po-Tao Chu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 63 days.

(21) Appl. No.: 14/597,470

(22) Filed: Jan. 15, 2015

(65) Prior Publication Data

US 2016/0211203 A1 Jul. 21, 2016

(51) Int. Cl.
*H01L 23/495* (2006.01)
*H01L 25/00* (2006.01)
*H01L 23/00* (2006.01)

(52) U.S. Cl.
CPC .... *H01L 23/49575* (2013.01); *H01L 23/4952* (2013.01); *H01L 23/49562* (2013.01); *H01L 24/83* (2013.01); *H01L 25/50* (2013.01); *H01L 2224/32245* (2013.01); *H01L 2224/48247* (2013.01); *H01L 2224/73265* (2013.01); *H01L 2224/83192* (2013.01); *H01L 2224/92247* (2013.01); *H01L 2924/0002* (2013.01); *H01L 2924/181* (2013.01)

(58) Field of Classification Search
CPC ............... H01L 23/49575; H01L 23/4952
USPC ............................................ 257/676
See application file for complete search history.

(56) References Cited

U.S. PATENT DOCUMENTS

| | | | |
|---|---|---|---|
| 7,808,102 B2 * | 10/2010 | Herbert | H01L 29/4175 257/685 |
| 8,659,149 B2 * | 2/2014 | French | H01L 23/147 257/725 |
| 9,082,759 B2 * | 7/2015 | Otremba | H01L 23/49562 |
| 2008/0304306 A1 * | 12/2008 | Chang | H01L 25/16 363/147 |
| 2014/0167060 A1 * | 6/2014 | Santangelo | H01L 27/0617 257/76 |

OTHER PUBLICATIONS

Professor He Zonghan. "Introduction to Semiconductor Process Equipment Configuration." Chemical and Materials Engineering Kaohsiung University of Applied Sciences. Mar. 10, 2012. p. 18.

* cited by examiner

*Primary Examiner* — Jamie C Niesz
(74) *Attorney, Agent, or Firm* — Eschweiler & Potashnik, LLC

(57) ABSTRACT

A semiconductor package having a lead frame over which a first device and a second device are spaced is provided. The lead frame includes a die pad upon which a first chip and a second chip are spaced and bonded. The first chip includes the first device, which has a first operating voltage. The second chip includes the second device, which has a second operating voltage greater than the first operating voltage. A dielectric layer is arranged between the die pad and the second device. A method for manufacturing the semiconductor package is also provided.

18 Claims, 9 Drawing Sheets

ISOLATION METHOD FOR A STAND ALONE HIGH VOLTAGE LATERALLY-DIFFUSED METAL-OXIDE SEMICONDUCTOR (LDMOS) TRANSISTOR

BACKGROUND

High voltage metal-oxide semiconductor (MOS) devices are semiconductor devices that can operate at high voltages, typically greater than about 100 volts. High voltage MOS devices find application in display drivers, power converters, motor controllers, vehicle power devices, and so on. High voltage MOS devices include laterally-diffused metal-oxide semiconductor (LDMOS) transistors and vertical-diffused metal-oxide semiconductor (VDMOS) transistors. Compared to VDMOS transistors, LDMOS transistors have faster switching speed, higher input impedance, lower power consumption, and compatibility with complementary metal-oxide-semiconductor (CMOS) processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
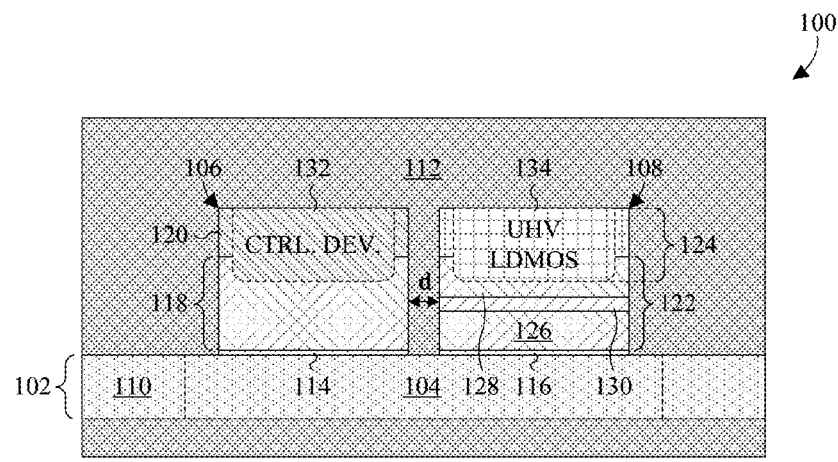
FIG. 1 illustrates a cross-sectional view of some embodiments of a semiconductor package having a lead frame over which a first device and a second device with a comparatively high operating voltage are spaced.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

High voltage MOS devices and low voltage control devices are often packaged together using lead frames. High voltage MOS devices are semiconductor devices that can operate at high voltages, typically greater than about 100 volts. High voltage MOS devices include, for example, laterally-diffused metal-oxide semiconductor (LDMOS) transistors and vertical-diffused metal-oxide semiconductor (VDMOS) transistors. Low voltage control devices are semiconductor devices limited to low operating voltages, typically less than about 40 volts. Low voltage control devices typically control or otherwise bias high voltage MOS devices. Low voltage control devices include, for example, integrated circuits (ICs) and/or metal-oxide-semiconductor field-effect transistors (MOSFETs).

When packaging high voltage MOS devices and low voltage control devices together using lead frames, the high voltage MOS devices and the low voltage control devices are typically isolated from one another laterally and vertically. Absent vertical isolation, a vertical conduction path can extend vertically from a high voltage MOS device to a die pad of a lead frame over which the high voltage MOS device is arranged, and vertically from the die pad to a low voltage control device arranged over the die pad. Further, absent lateral isolation, a lateral conduction path can extend laterally between a high voltage MOS device and a low voltage control device, independent of a lead frame over which the high voltage MOS device and the low voltage control device are arranged. Due to the different ranges in operating voltages, either one of the conduction paths can result in failure or burnout of low voltage control devices.

According to an approach to packaging high voltage MOS devices and low voltage control devices together with lead frames, a chip having a low voltage control device and a high voltage MOS device (e.g., an LDMOS transistor) is secured to a die pad of a lead frame. A vertical isolation layer is arranged over the die pad below the low voltage control device and the high voltage MOS devices for vertical isolation, and a lateral isolation layer is arranged between the low voltage control device and the high voltage MOS device for lateral isolation. A molded housing is then formed around the die pad, the low voltage control device, and the high voltage MOS device. A challenge with this approach is that the low voltage control device and the high voltage MOS device are formed together. This increases costs due to the lateral isolation layer, and limits the package to low voltage control devices and high voltage MOS devices with compatible manufacturing processes. Further, the thickness of the lateral isolation layer reduces device density.

As an alternative to packaging high voltage MOS devices and low voltage control devices together with lead frames, high voltage MOS devices and low voltage control devices can be independently packaged with lead frames. For example, a first chip having a low voltage control device is secured to a first die pad of a first lead frame. A first molded housing is then formed around the first die pad and the low voltage control device. Further, a second chip having a high voltage MOS device (e.g., a VDMOS transistor) is secured to a second die pad of a second lead frame. A second molded housing is then formed around the second die pad and the VDMOS transistor. However, independent packages increase costs, and use more surface area on printed circuit boards or other structures to which the packages are mounted.

In view of the foregoing, the present disclosure is directed to a semiconductor package having a pair of chips laterally spaced over a die pad of a lead frame. A first chip of the pair has a first device (e.g., a control device) and a second chip of the pair has a second device (e.g., an LDMOS transistor). The second device has an operating voltage (e.g., greater than about 100 volts, such as, for example, between about 100 volts to about 700 volts) exceeding an operating voltage of the first device (e.g., less than about 40 volts), and is isolated from the die pad by a vertical isolation layer interposed between the die pad and the second device. Advantageously, the semiconductor package includes both the first and second devices on a single lead frame, has reduced volume compared to individual packages for the first and second devices, and conducts heat away from the first and second devices.

The present disclosure is also directed to a method for manufacturing a semiconductor package having a pair of chips laterally spaced over a die pad of a lead frame. A first chip of the pair having a first device (e.g., a control device) is provided and bonded to the die pad. A second chip of the pair having a second device (e.g., and LDMOS transistor) is provided. The second device has an operating voltage exceeding an operating voltage of the first device. The second chip is bonded to the die pad at a location laterally spaced from the first chip and with a vertical isolation layer arranged between the second device and the die pad. Advantageously, the method reduces costs, since a single package is formed and additional masks are not used to form a lateral isolation layer between the first and second devices.

With reference to FIG. 1, a cross-sectional view 100 of a semiconductor package according to some embodiments is provided. A lead frame 102 includes a die pad 104 over which a first chip 106 and a second chip 108 are arranged, and support bars 110 extending laterally from the die pad 104. The lead frame 102, including the die pad 104 and the support bars 110, is conductive, and is or otherwise includes, for example, a metal, such as, for example, copper or aluminum, or doped polysilicon. A housing 112 surrounds the die pad 104, the support bars 110, and the first and second chips 106, 108. Typically, the housing 112 is molded, and/or is or otherwise includes a polymeric material.

The first and second chips 106, 108 are bonded to the die pad 104, typically by a first bonding layer 114 and a separate, second bonding layer 116, respectively. The first and second bonding layers 114, 116 are or otherwise include, for example, epoxy or insulating gel. Further, the first and second chips 106, 108 are typically spaced apart over the die pad 104 by a distance d, which is at least about one micrometer (e.g., between about one micrometer and about two micrometers) to ensure lateral isolation between the first and second chips 106, 108. In some embodiments, the first and second chips 106, 108 are spaced apart by an air gap for lateral isolation. Since the air gap has a lower dielectric constant κ than silicon dioxide or other dielectric materials, the air gap can achieve the same lateral isolation as the dielectric materials with less thickness. For example, where known solutions typically include a lateral isolation layer of at least two micrometers thick for lateral isolation, the air gap can achieve the same lateral isolation with a thickness of between about one and two micrometers. Therefore, device density can be increased using the air gap.

The first chip 106 includes a first substrate 118 over and/or within which a first device layer 120 is arranged, and the second chip 108 includes a second substrate 122 over and/or within which a second device layer 124 is arranged. In some embodiments, the first and second substrates 118, 122 correspond to bulk semiconductor substrates, silicon-on-insulator (SOI) substrates, and/or polysilicon-on-insulator (POI) substrates.

The first device layer 120 includes a first device 132, and the second device layer 124 includes a second device 134. The first device 132 has a first operating voltage, and the second device 134 has a second operating voltage greater than the first operating voltage. An operating voltage is, for example, a voltage across terminals of a transistor. The first operating voltage is typically a low voltage (e.g., less than about 40 volts) or an ultra-low voltage (e.g., less than about 10 volts), and the second operating voltage is typically a medium voltage (e.g., greater than about 40 volts), a high voltage (e.g., greater than about 100 volts) or an ultra-high voltage (UHV) (e.g., greater than about 200 volts). Examples of the second device 134 include an LDMOS transistor, a VDMOS transistor, a double-diffused metal-oxide semiconductor (DMOS) transistor, a drain-extended metal-oxide semiconductor (DEMOS) transistor, and a double-diffused drain metal-oxide semiconductor (DDD-MOS) transistor. In some embodiments, the second device 134 includes an ultra-high voltage LDMOS transistor, and the first device 132 includes a control device with a comparatively low voltage. In some embodiments, the first device 132 is a semiconductor device typically configured to control or otherwise bias the second device 134, and the second device 134 is a semiconductor device typically configured for power transfer, power conversion, or signal amplification.

A vertical isolation layer 130 is arranged between the second device 134 and the die pad 104. The vertical isolation layer 130 is a dielectric layer integrated with or otherwise associated with the second chip 108 that electrically isolates the second device 134 from the die pad 104. In contrast, the first chip 106 typically doesn't include a vertical isolation layer arranged between the first device 132 and the die pad 104. As illustrated, in some embodiments where the second substrate 122 is an SOI substrate, the vertical isolation layer 130 includes an oxide layer disposed between a first silicon layer 126 and a second silicon layer 128. In alternative embodiments, the vertical isolation layer 130 is arranged over a backside of the second chip 108 and includes a dielectric material, such as, for example, silicon dioxide or silicon nitride. In other alternative embodiments, the vertical isolation layer 130 includes or otherwise corresponds to a barrier implant layer implanted into the second substrate 122. In yet other alternative embodiments, the vertical isolation layer 130 includes or otherwise corresponds to a bonding layer (e.g., the second bonding layer 116) arranged between the lead frame 102 and the second chip 108. The bonding layer is typically an organic material.

By packaging the first and second chips 106, 108 together, costs are reduced and total package volume is reduced. Further, by using independent or standalone chips for the first and second devices 132, 134, the first and second devices 132, 134 can advantageously have independent manufacturing processes. Even more, by spacing the first and second chips 106, 108 over the lead frame 102, and arranging the vertical isolation layer 130 between the second device 134 and the lead frame 102, the first and second devices 132, 134 are both laterally and vertically isolated from each other. This advantageously reduces the likelihood of failure or burnout of the first device 132, which typically operates at a lower voltage than the second device 134, and can increase device density.

Figure 2:
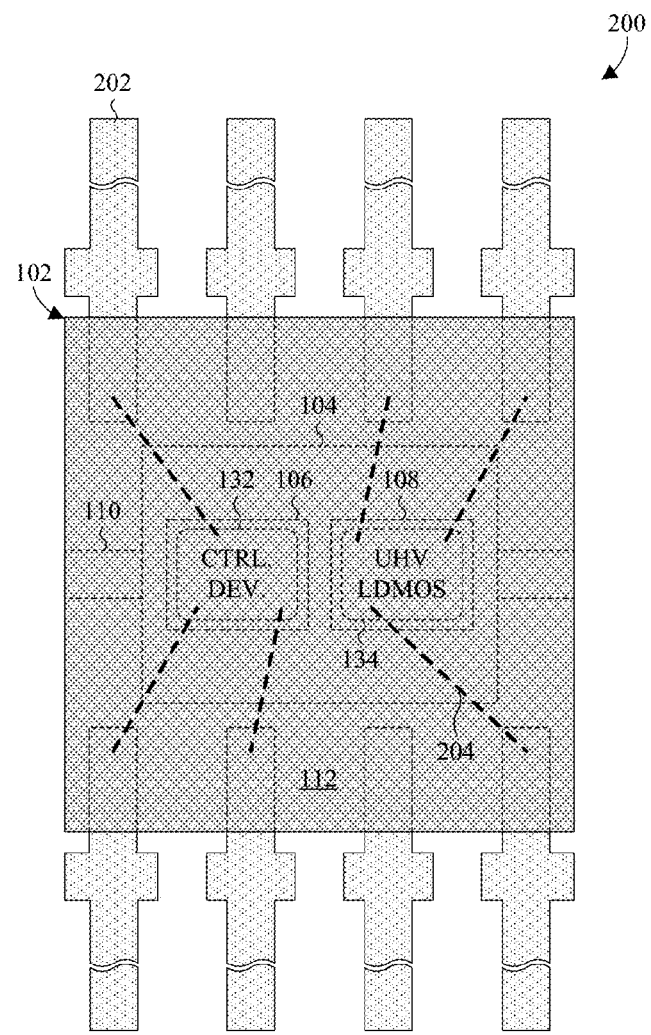
FIG. 2 illustrates a top view of some embodiments of the semiconductor package of FIG. 1.

With reference to FIG. 2, a top view 200 of the semiconductor package of FIG. 1 according to some embodiments is provided. A lead frame 102 includes a die pad 104 and support bars 110 extending laterally from the die pad 104. A first chip 106 is arranged over and bonded to the die pad 104, and a second chip 108 spaced from the first chip 106 is arranged over and bonded to the die pad 104. The first and second chips 106, 108 correspondingly include a first device 132 and a second device 134.

A plurality of leads 202 are spaced from each other on opposing sides of the die pad 104 and are electrically coupled to the first and second devices 132, 134 by wire bonds 204. For example, the leads 202 are electrically coupled to source, drain, and/or gate regions of the first and second devices 132, 134. The leads 202 extend from within a housing 112 to the external environment, and carry signals received from the first and second devices 132, 134 through the wire bonds 204 to the external environment. The housing 112 surrounds the die pad 104, the support bars 110, part of the leads 402, the wire bonds 204, and the first and second chips 106, 108. The wire bonds 204 are conductive, and are or otherwise include, for example, aluminum, copper, gold, or silver.

Figure 3:
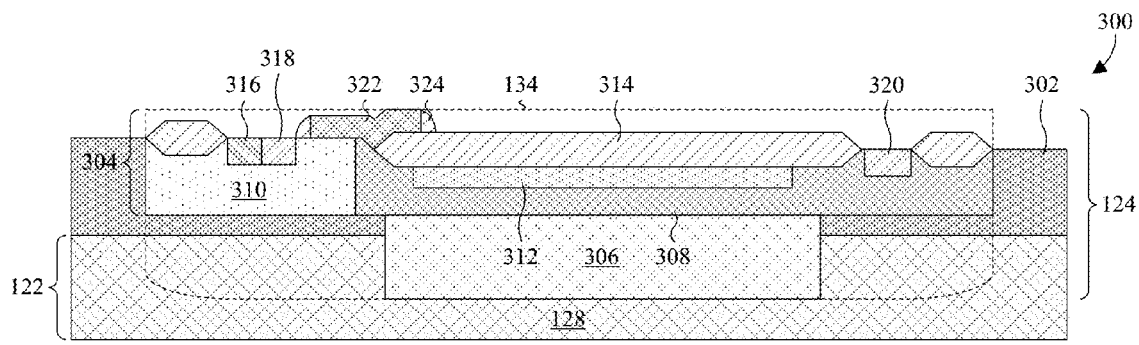
FIG. 3 illustrates a cross-sectional view of some embodiments of the second device of FIG. 1.

With reference to FIG. 3, an enlarged cross-sectional view 300 of the semiconductor package of FIG. 1 according to some embodiments is provided to illustrate the second device 134 of FIG. 1 as an LDMOS transistor. A device layer 124 including the second device 134 is arranged over and/or within a substrate 122. Examples of the substrate 122 include a bulk semiconductor substrate, an SOI substrate, and/or a POI substrate. Where the substrate 122 is a SOI substrate, the device layer 124 is arranged over and/or within a silicon layer 128 of the substrate 122.

A p-type epitaxial layer 302 is arranged over the substrate 122 with a first region 304 extending into the p-type epitaxial layer 302. In some embodiments, the thickness of the p-type epitaxial layer 302 surrounding the first region 304 tapers from one side of the first region 304 to an opposite side of the first region 304. A second, pre-high voltage n-well (HVNW) region 306 having a smaller footprint than the first region 304 extends from a base of the first region 304 into the substrate 122. A HVNW region 308 is arranged in the first region 304 over the pre-HVNW region 306, and a p-well region 310 is arranged in the first region 304 laterally abutting the HVNW region 308. In some embodiments, the height of the p-well region 310 is greater than the height of the HVNW region 308. A ring-shaped p-type region 312 is arranged in the HVNW region 308 and covered by a first field oxide (FOX) layer 314.

A highly doped p-type region 316 and a first highly doped n-type region 318 are arranged abutting each other in the p-well region 310 with the first highly doped n-type region 318 closest to the HVNW region 308. Further, a second highly doped n-type region 320 is arranged in the HVNW region 308 on an opposite side of the ring-shaped p-type region 312 as the p-well region 310. A doped polysilicon layer 322 is arranged over the p-well region 310 and the HVNW region 308, and extends from the first highly doped n-type region 318 to approximately even with a sidewall of the ring-shaped p-type region 312. Dielectric spacers 324 are arranged along sidewalls of the doped polysilicon layer 322 to space the doped polysilicon layer 322 from the first highly doped n-type region 318.

Figure 4:
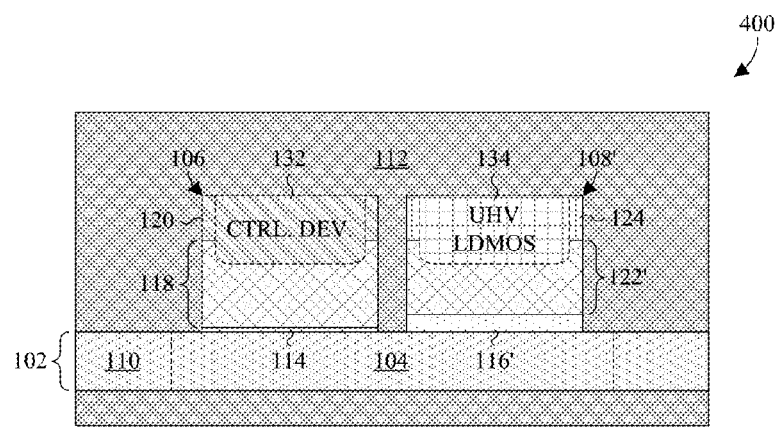
FIG. 4 illustrates a cross-sectional view of alternative embodiments of a semiconductor package having a lead frame over which a first device and a second device with a comparatively high operating voltage are spaced.

With reference to FIG. 4, a cross-sectional view 400 of a semiconductor package according to alternative embodiments is provided. A lead frame 102 includes a die pad 104 and support bars 110 extending laterally from the die pad 104. A first chip 106 is arranged over and bonded to the die pad 104 by a first bonding layer 114, and a second chip 108' spaced from the first chip 106 is arranged over and bonded to the die pad 104 by a second bonding layer 116'. The second bonding layer 116' is thicker than the first bonding layer 114 and has a thickness sufficient to vertically isolate the second chip 108' from the die pad 104. As such, the second bonding layer 116' is or otherwise corresponds to a vertical isolation layer. Examples of the first and seconding bonding layers 114, 116' include epoxy and insulation gel. A housing 112 surrounds the die pad 104, the support bars 110, and the first and second chips 106, 108'.

The first chip 106 includes a first substrate 118 over and/or within which a first device layer 120 is arranged, and the second chip 108' includes a second substrate 122' over and/or within which a second device layer 124 is arranged. The first and second substrates 118, 122' correspond to, for example, bulk semiconductor substrates, SOI substrates, and/or POI substrates. The first device layer 120 includes a first device 132, and the second device layer 124 includes a second device 134.

Figure 5:
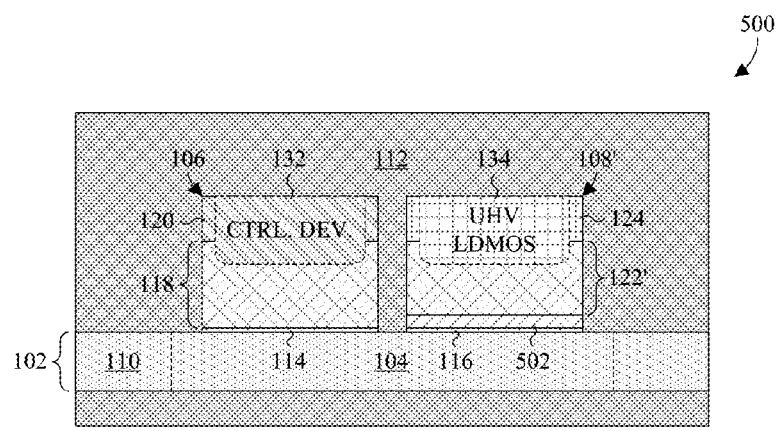
FIG. 5 illustrates a cross-sectional view of other alternative embodiments of a semiconductor package having a lead frame over which a first device and a second device with a comparatively high operating voltage are spaced.

With reference to FIG. 5, a cross-sectional view 500 of a semiconductor package according to other alternative embodiments is provided. A lead frame 102 includes a die pad 104 and support bars 110 extending laterally from the die pad 104. A first chip 106 is arranged over and bonded to the die pad 104 by a first bonding layer 114, and a second chip 108' spaced from the first chip 106 is arranged over and bonded to the die pad 104 by a second bonding layer 116. The second chip 108' is bonded to the die pad 104 through a vertical isolation layer 502 arranged on a backside of the second chip 108'. The vertical isolation layer 502 is or otherwise includes a dielectric material, such as, for example, an oxide, and provides vertical isolation between the second chip 108' and the die pad 104. A housing 112 surrounds the die pad 104, the support bars 110, and the first and second chips 106, 108'.

The first chip 106 includes a first substrate 118 over and/or within which a first device layer 120 is arranged, and the second chip 108' includes a second substrate 122' over and/or within which a second device layer 124 is arranged. The first device layer 120 includes a first device 132, and the second device layer 124 includes a second device 134.

Figure 6:
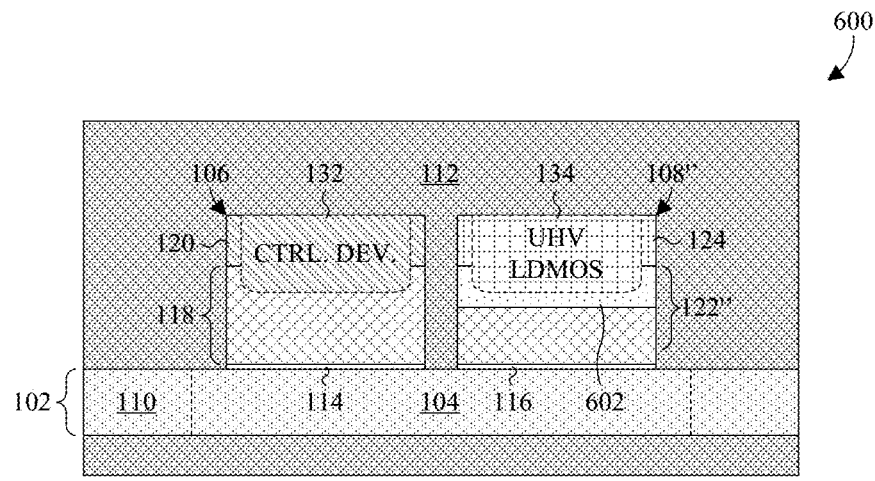
FIG. 6 illustrates a cross-sectional view of yet other alternative embodiments of a semiconductor package having a lead frame over which a first device and a second device with a comparatively high operating voltage are spaced.

With reference to FIG. 6, a cross-sectional view 600 of a semiconductor package according to yet other alternative embodiments is provided. A lead frame 102 includes a die pad 104 and support bars 110 extending laterally from the die pad 104. A first chip 106 is arranged over and bonded to the die pad 104 by a first bonding layer 114, and a second chip 108" spaced from the first chip 106 is arranged over and bonded to the die pad 104 by a second bonding layer 116. A housing 112 surrounds the die pad 104, the support bars 110, and the first and second chips 106, 108".

The first chip 106 includes a first device layer 120 arranged over and/or within a first substrate 118, and the second chip 108" includes a second device layer 124 arranged over and/or within a second substrate 122". The first device layer 120 includes a first device 132, and the second device layer 124 includes a second device 134. The second substrate 122" includes a barrier implant isolation layer 602 that vertically isolates the second device 134 from the die pad 104. As such, the barrier implant isolation layer 602 is or otherwise corresponds to a vertical isolation layer. The first and second substrates 118, 122" correspond to, for example, bulk semiconductor substrates, SOI substrates, and/or POI substrates.

Figure 7:
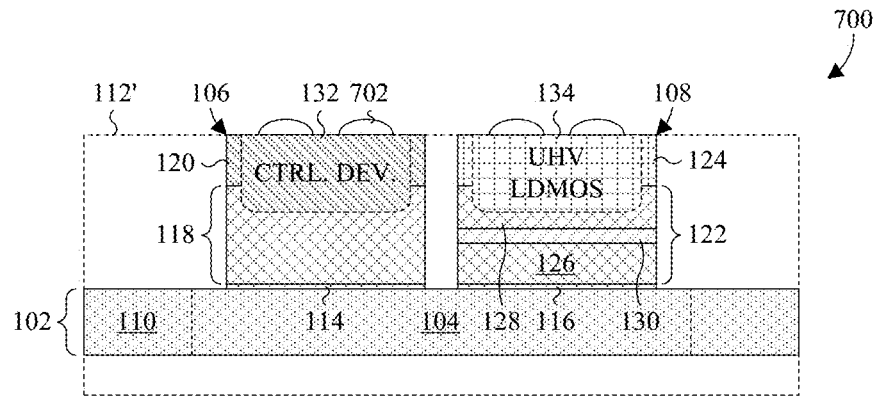
FIG. 7 illustrates a cross-sectional view of still other embodiments of a semiconductor package having a lead frame over which a first device and a second device with a comparatively high operating voltage are spaced.

With reference to FIG. 7, a cross-sectional view 700 of a semiconductor package according to still other alternative embodiments is provided. A lead frame 102 includes a die pad 104 and support bars 110 extending laterally from the die pad 104. A first chip 106 is arranged over and bonded to the die pad 104 by a first bonding layer 114, and a second chip 108 spaced from the first chip 106 is arranged over and bonded to the die pad 104 by a second bonding layer 116.

The first chip 106 includes a first substrate 118 over and/or within which a first device layer 120 is arranged, and the second chip 108 includes a second substrate 122 over and/or within which a second device layer 124 is arranged. In some embodiments, the second substrate 122 includes a first silicon layer 126 and a second silicon layer 128 stacked on opposing sides of an insulating layer 130. The first device layer 120 includes a first device 132, and the second device layer 124 includes a second device 134. The first device 132 typically operates at a low voltage (e.g., less than about 40 volts), and the second device 134 typically operates at a high voltage (e.g., greater than about 100 volts). To avoid the risk of failure or burnout of the first device 132, a vertical isolation layer 130 is arranged between the second device 134 and the lead frame 102.

Solder balls 702 are arranged over the first and second devices 132, 134 to facilitate flip chip bonding of the first and second devices 132, 134 to another device or structure (not shown). In some embodiments, as illustrated, a housing 112' encapsulates the die pad 104, the support bars 110, and the first and second chips 106, 108, while the solder balls 702 remain exposed. In other embodiments, the housing 112' surrounds the die pad 104, the support bars 110, the first and second chips 106, 108, and the other device or structure, such that the other device or structure is part of the semiconductor package. Typically, the housing 112' is molded, and/or is or otherwise includes a polymeric material.

The foregoing dealt with a vertical isolation layer 130, 116', 502, 602 arranged between a second device 134 and a die pad 104. In alternative embodiments, the vertical isolation layer 130, 116', 502, 602 is arranged between the second device 134 and the die pad 104 together with a second vertical isolation layer (not shown) arranged between the first device 132 and the die pad 104. The second vertical isolation layer vertically isolates the first device 132 from the die pad 104 and corresponds to, for example, an insulating layer of an SOI substrate, a bonding layer, an implant isolation layer, an oxide layer, or the like. In other alternative embodiments, the vertical isolation layer 130, 116', 502, 602 is arranged between the first device 132 and the die pad 104, but not between the second device 134 and the die pad 104. In such embodiments, the second device 134 typically doesn't include a vertical isolation layer arranged between the second device 134 and the die pad 104.

Figure 8:
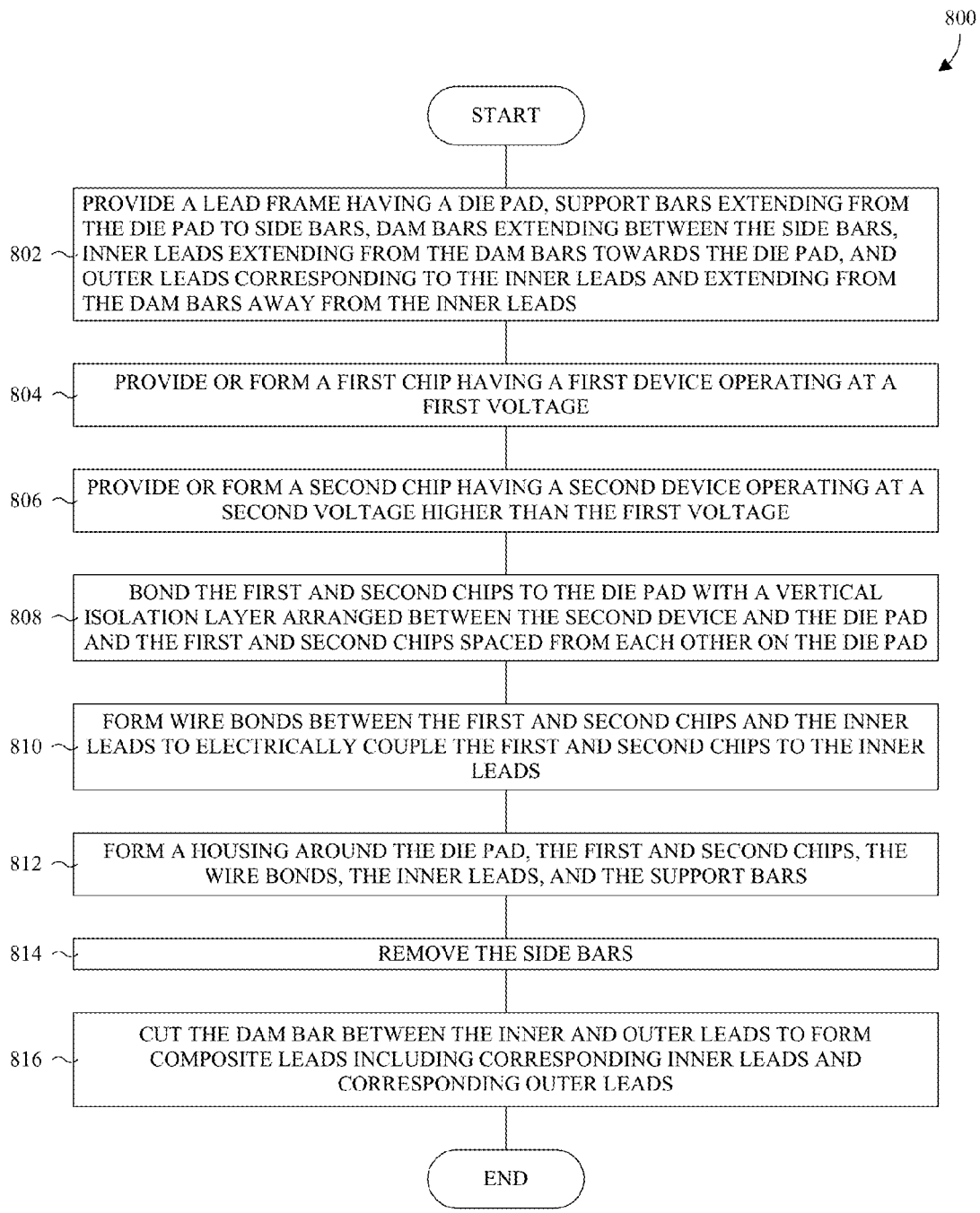
FIG. 8 illustrates a flow chart of some embodiments of a method for manufacturing a semiconductor package having a lead frame over which a first device and a second device with a comparatively high operating voltage are spaced.

With reference to FIG. 8, a flowchart 800 provides some embodiments of a method for manufacturing a semiconductor package having a lead frame over which a first device and a second device with a comparatively high operating voltage are spaced.

At 802, a lead frame is provided. The lead frame includes a die pad, support bars extending from the die pad to side bars, dam bars extending between the side bars, inner leads extending from the dam bars towards the die pad, and outer leads corresponding to the inner leads and extending from the dam bars away from the inner leads.

At 804, a first chip having a first device operating at a first voltage is provided or formed.

At 806, a second chip is provided or formed. The second chip includes a second device operating at a second voltage higher than the first voltage.

At 808, the first and second chips are bonded to the die pad with a vertical isolation layer arranged between the second device and the die pad and with the first and second chips spaced from each other on the die pad. The first chip is typically bonded to the die pad without a vertical isolation layer arranged between the first device and the die pad, whereby a conduction path typically extends between the first device and the die pad.

At 810, wire bonds are formed between the first and second chips and the inner leads to electrically couple the first and second chips to the inner leads.

At 812, a housing is formed around the die pad, the first and second chips, the wire bonds, the inner leads, and the support bars.

At 814, the side bars are removed.

At 816, the dam bar is cut between the inner and outer leads to form composite leads including corresponding inner leads and corresponding outer leads.

Advantageously, the method reduces costs. Lateral isolation is performed using spacing between the first and second chips. This eliminates costs associated with additional masks for lateral isolation. Further, the first and second chips are packaged together. This eliminates costs associated with individually packaging the first and second chips.

While the disclosed methods (e.g., the method described by the flowchart 800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 9-17, cross-sectional and top views of some embodiments of a semiconductor package at various stages of manufacture are provided to illustrate the method of FIG. 8. Although FIGS. 9-17 are described in relation to the method, it will be appreciated that the structures disclosed in FIGS. 9-17 are not limited to the method, but instead may stand alone as structures independent of the method. Similarly, although the method is described in relation to FIGS. 9-17, it will be appreciated that the method is not limited to the structures disclosed in FIGS. 9-17, but instead may stand alone independent of the structures disclosed in FIGS. 9-17.

Figure 9:
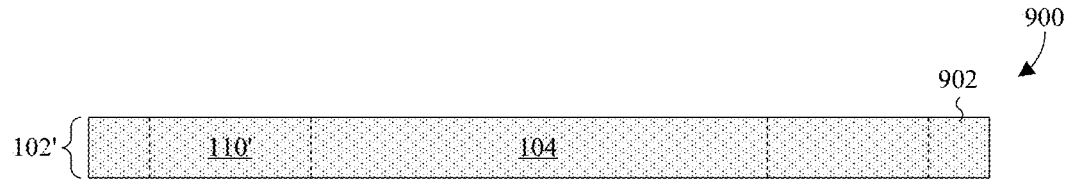
FIGS. 9-17 illustrate a series of cross-sectional and top views of some embodiments of a semiconductor package at intermediate stages of manufacture, the semiconductor package having a lead frame over which a first device and a second device with a comparatively high operating voltage are spaced.

FIG. 9 illustrates a cross-sectional view 900 of some embodiments corresponding to Act 802 of FIG. 8. As illustrated, a lead frame 102' is provided. The lead frame 102' includes a die pad 104 with support bars 110' extending laterally from the die pad 104 to side bars 902 arranged on opposing sides of the die pad 104. The lead frame 102' is or otherwise includes, for example, a metal, such as, for example, copper or aluminum, or doped polysilicon.

Figure 10:
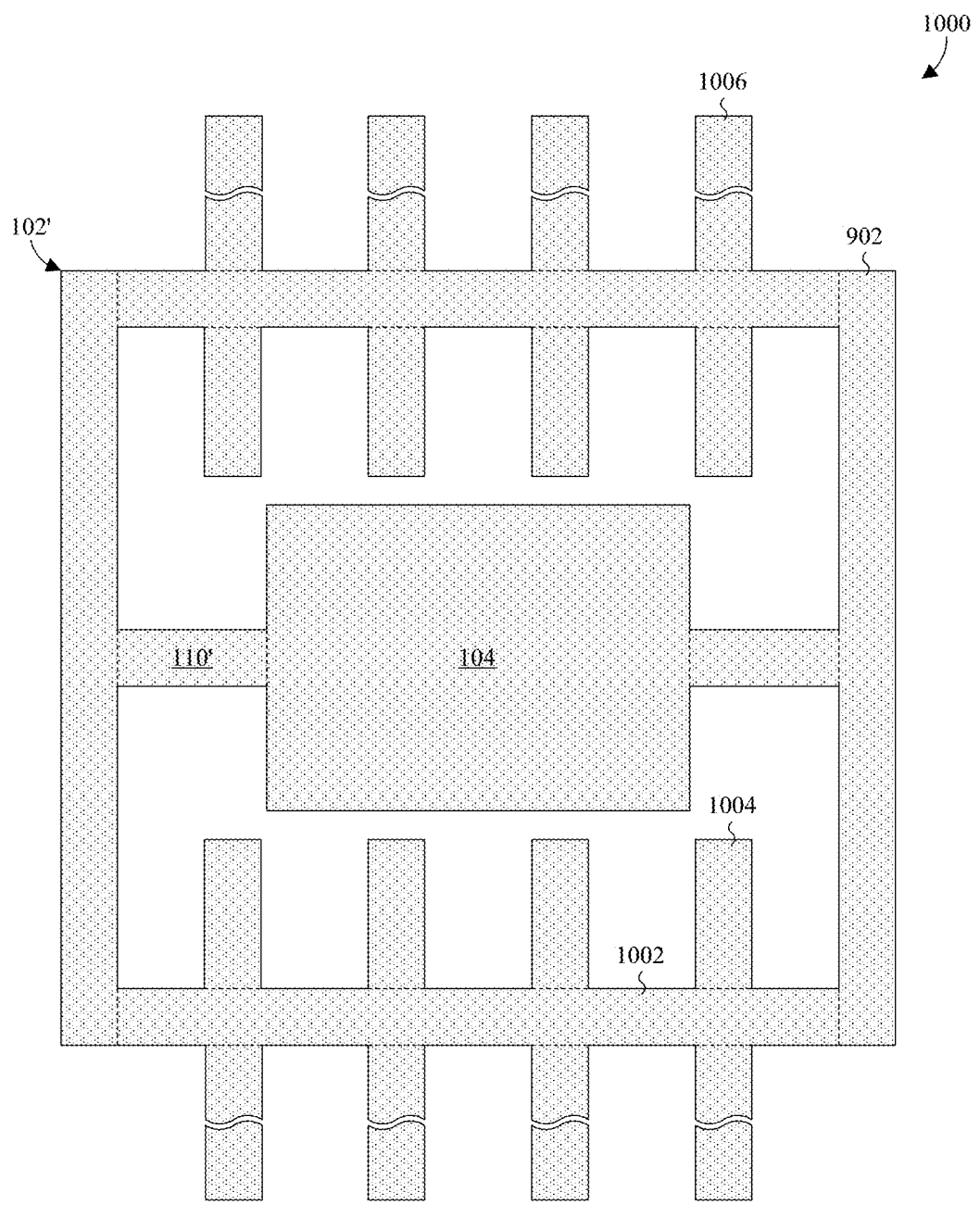

FIG. 10 illustrates a top view 1000 of some embodiments corresponding to Act 802 of FIG. 8. As illustrated, a lead frame 102' is provided. The lead frame 102' includes a die pad 104 with support bars 110' extending laterally from the die pad 104 to side bars 902 arranged on first opposing sides of the die pad 104. The lead frame 102' further includes dam bars 1002 arranged on second opposing sides of the die pad 104 and extending laterally between the side bars 902, typically parallel to the support bars 110'. The dam bars 1002 and the side bars 902 define a ring-shaped support structure that suspends the die pad 104 within the ring-shaped support structure through the support bars 110'.

Inner leads 1004 are spaced on the second opposing sides between the dam bars 1002 and the die pad 104, and outer leads 1006 corresponding to the inner leads 1004 are spaced on the second opposing sides outside the ring-shaped support structure. Typically, there is a one-to-one correspondence between the inner leads 1004 and the outer leads 1006, and the outer leads 1006 are vertically and laterally aligned with ends of the corresponding inner leads 1004. The inner leads 1004 extend laterally from the dam bars 1002 towards the die pad 104, while remaining spaced from the die pad 104 and from each other. The outer leads 1006 extend laterally from the dam bars 1002 away from the die pad 104. Typically, the outer leads 1006 extend from the dam bars 1002 opposite the corresponding inner leads 1004.

Figure 11:
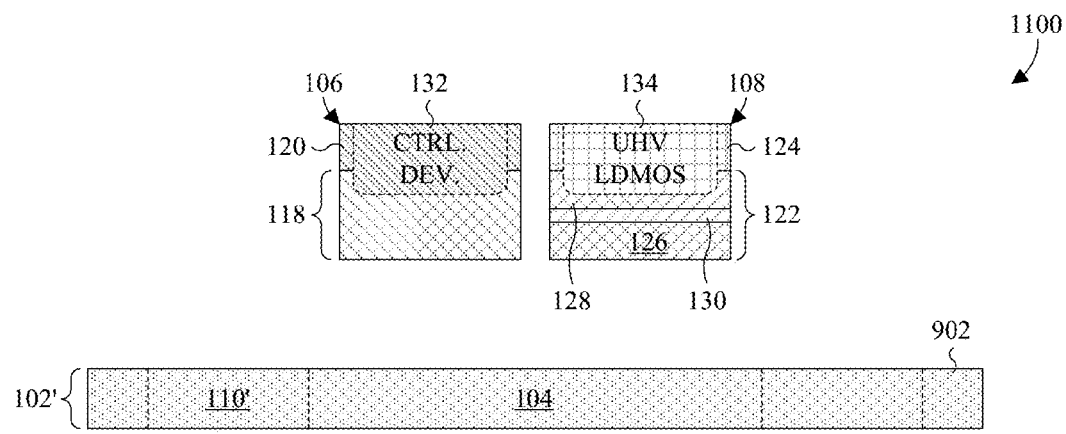

FIG. 11 illustrates a cross-sectional view 1100 of some embodiments corresponding to Acts 804 and 806 of FIG. 8. As illustrated, a first chip 106 and a second chip 108 are provided. The first chip 106 includes a first substrate 118 over and/or within which a first device layer 120 is arranged, and the second chip 108 includes a second substrate 122 over and/or within which a second device layer 124 is arranged. In some embodiments, the second substrate 122 corresponds to a SOI substrate including a first silicon layer 126 and a second silicon layer 128 stacked on opposing sides of an insulating layer 130. The first device layer 120 includes a first device 132, and the second device layer 124 includes a second device 134. The first device 132 has a first operating voltage, and the second device 134 has a second operating voltage greater than the first operating voltage.

In alternative embodiments, the second chip 108 is formed with a dielectric layer arranged on a backside of the second chip 108 or a barrier implant layer arranged in the second substrate 122 below the second device 134. For example, the second device 134 is formed in a wafer, and a dielectric layer is formed on a backside of the wafer. The dielectric layer is or otherwise includes, for example, silicon dioxide or silicon nitride. The wafer is then singulated or diced to form the second chip 108. As another example, a wafer is provided and a barrier implant layer is formed in the wafer. The second device 134 is then formed over and/or within the barrier implant layer, and the wafer is singulated or diced to form the second chip 108.

Figure 12:
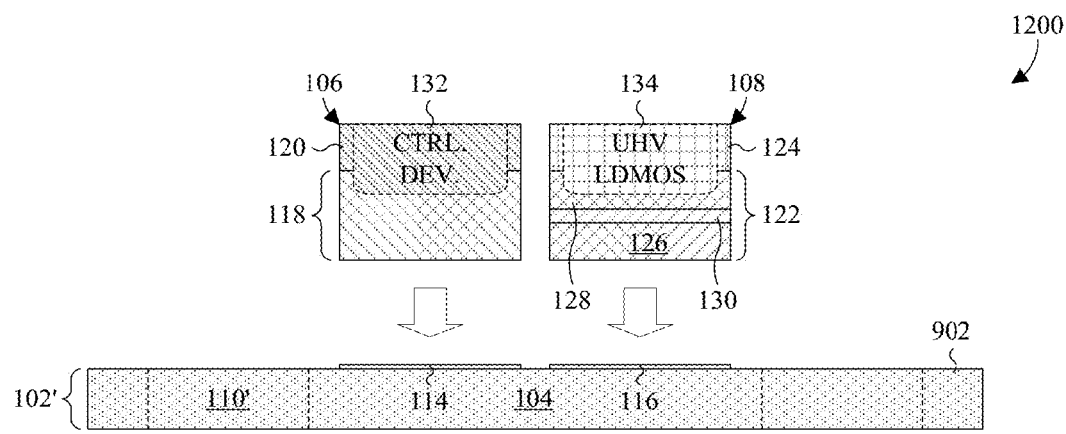

FIG. 12 illustrates a cross-sectional view 1200 of some embodiments corresponding to Act 808 of FIG. 8. As illustrated, a first bonding layer 114 and a second bonding layer 116 corresponding to a first chip 106 and a second chip 108 are formed on a die pad 104 of a lead frame 102'. In alternative embodiments, the first and second bonding layers 114, 116 are formed on backsides of the first and second chips 106, 108. The first and second bonding layers 114, 116 are typically formed with the approximate footprints of the first and second chips 106, 108. Further, where formed on the die pad 104, the first and second bonding layers 114, 116 are typically formed spaced from each other by at least about one micrometer (e.g., between about one micrometer and about two micrometers). The first and second bonding layers 114, 116 are or otherwise include, for example, epoxy, insulating gel or some other adhesive, and can be formed by, for example, ejecting the bonding material through a nozzle of a dispensing tool.

After forming the first and second bonding layers 114, 116, the first and second chips 106, 108 are bonded to the die pad 104 through the first and second bonding layers 114, 116. The first and second chips 106, 108 are bonded to the die pad 104 spaced from each other, typically by at least about one micrometer (e.g., between about one micrometer and about two micrometers). Further, the first and second chips 106, 108 are bonded to the die pad 104 with a vertical isolation layer 130 arranged between the second device 134 and the lead frame 102. As illustrated, in some embodiments where a substrate 122 of the second chip 108 corresponds to an SOI substrate, the vertical isolation layer 130 corresponds to an insulating layer of the substrate 122. In alternative embodiments, the vertical isolation layer 130 corresponds to a barrier implant isolation layer of the substrate 122, a dielectric layer formed on a backside of the second chip 108, or the second bonding layer 116.

Figure 13:
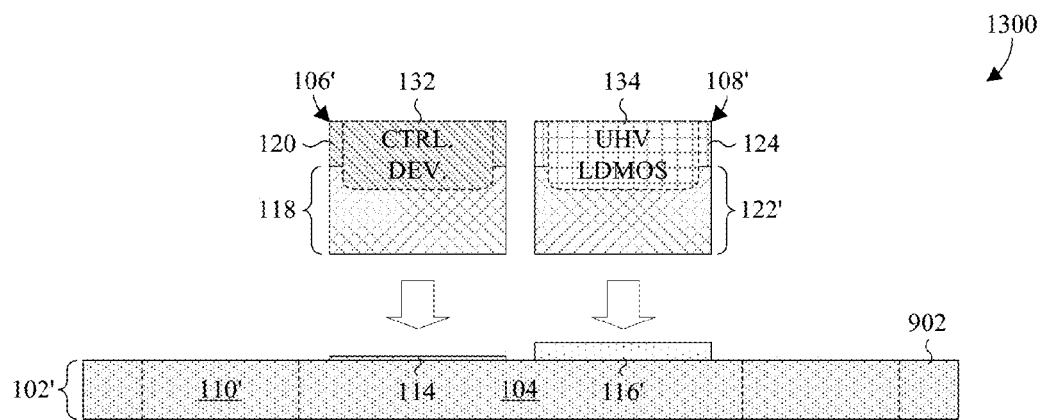

FIG. 13 illustrates a cross-sectional view 1300 of other embodiments corresponding to Act 808 of FIG. 8. As illustrated, a first bonding layer 114 and a second bonding layer 116' corresponding to a first chip 106 and a second chip 108' are formed on a die pad 104 of a lead frame 102'. In alternative embodiments, the first and second bonding layers 114, 116' are formed on backsides of the first and second chips 106, 108'. The second bonding layer 116' is formed with a greater thickness than the first bonding layer 114 and has a thickness sufficient to vertically isolate the second chip 108' from the die pad 104, whereby the second bonding layer 116' is or otherwise corresponds to a vertical isolation layer. The first and second bonding layers 114, 116' are or otherwise include, for example, epoxy, insulating gel or some other adhesive.

After forming the first and second bonding layers 114, 116', the first and second chips 106, 108' are bonded to the die pad 104 through the first and second bonding layers 114, 116'. The first and second chips 106, 108' are bonded to the die pad 104 spaced from each other, typically by at least about one micrometer. In some embodiments, the first and second chips 106, 108' may be spaced from each other by between about one micrometer and about two micrometers.

Figure 14:
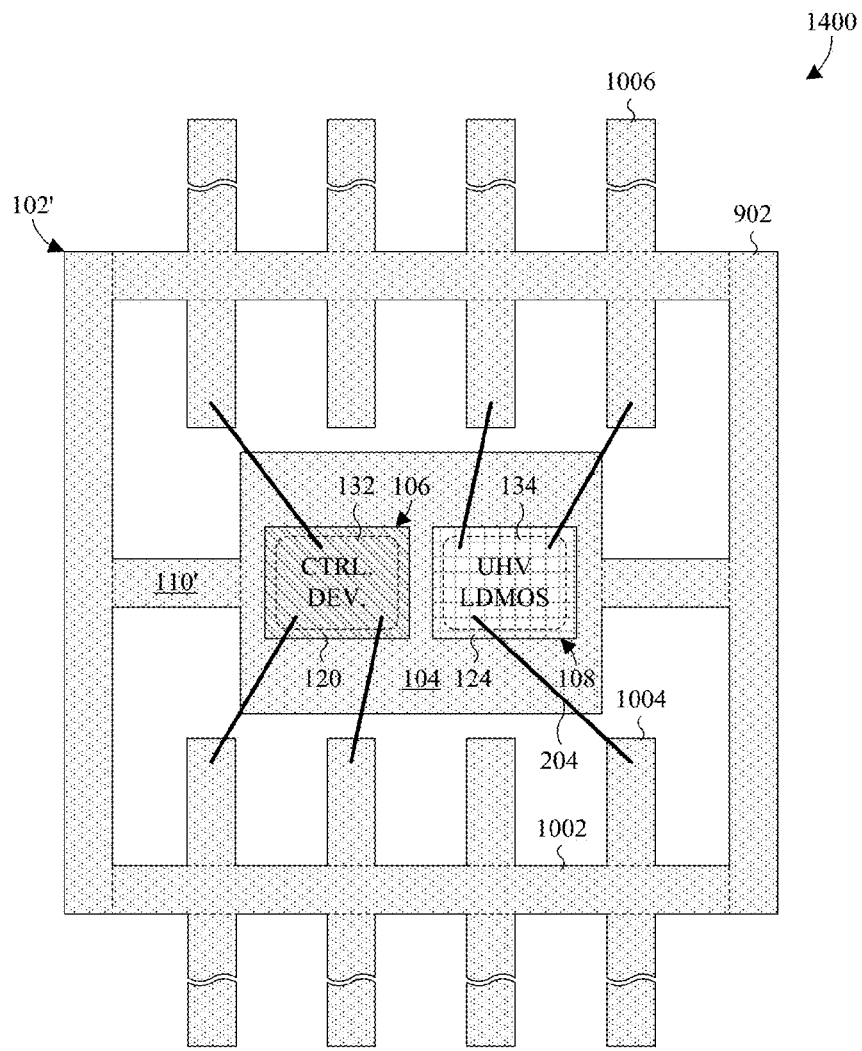

FIG. 14 illustrates a top view 1400 of some embodiments corresponding to Act 810 of FIG. 8. As illustrated, wire bonds 204 are formed from first and second devices 132, 134 to inner leads 1004 of a lead frame 102'. For example, the wire bonds 204 are formed from source, drain, and/or gate regions of the first and second devices 132, 134 to the inner leads 1004. The wire bonds 204 are formed from a conductive material, such as, for example, aluminum, copper, gold, or silver.

Figure 15:
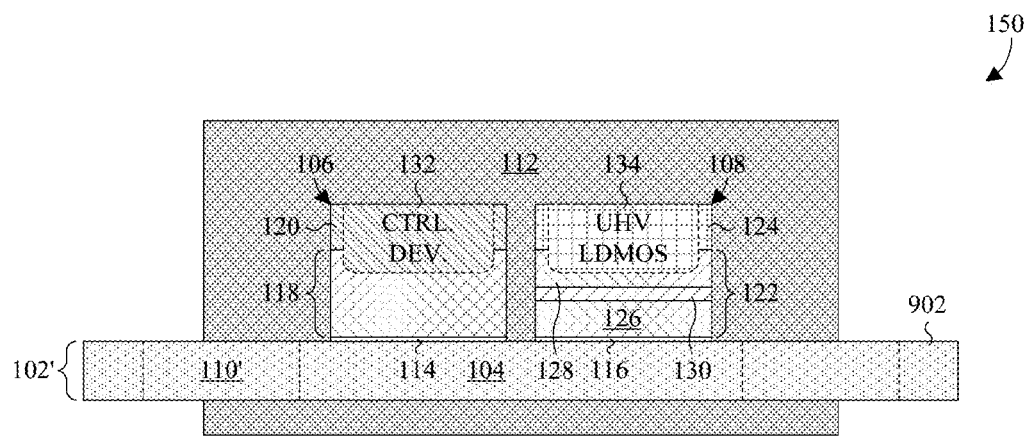

FIG. 15 illustrates a cross-sectional view 1500 of some embodiments corresponding to Act 812 of FIG. 8. As illustrated, a housing 112 is formed around a die pad 104 of a lead frame 102', first and second chips 106, 108 arranged over the die pad 104, and support bars 110' of the lead frame 102' that extend laterally from the die pad 104. The housing 112 typically encapsulates the die pad 104 and the first and second chips 106, 108, and is typically formed by molding. The housing 112 is or otherwise includes, for example, a polymeric material.

Figure 16:
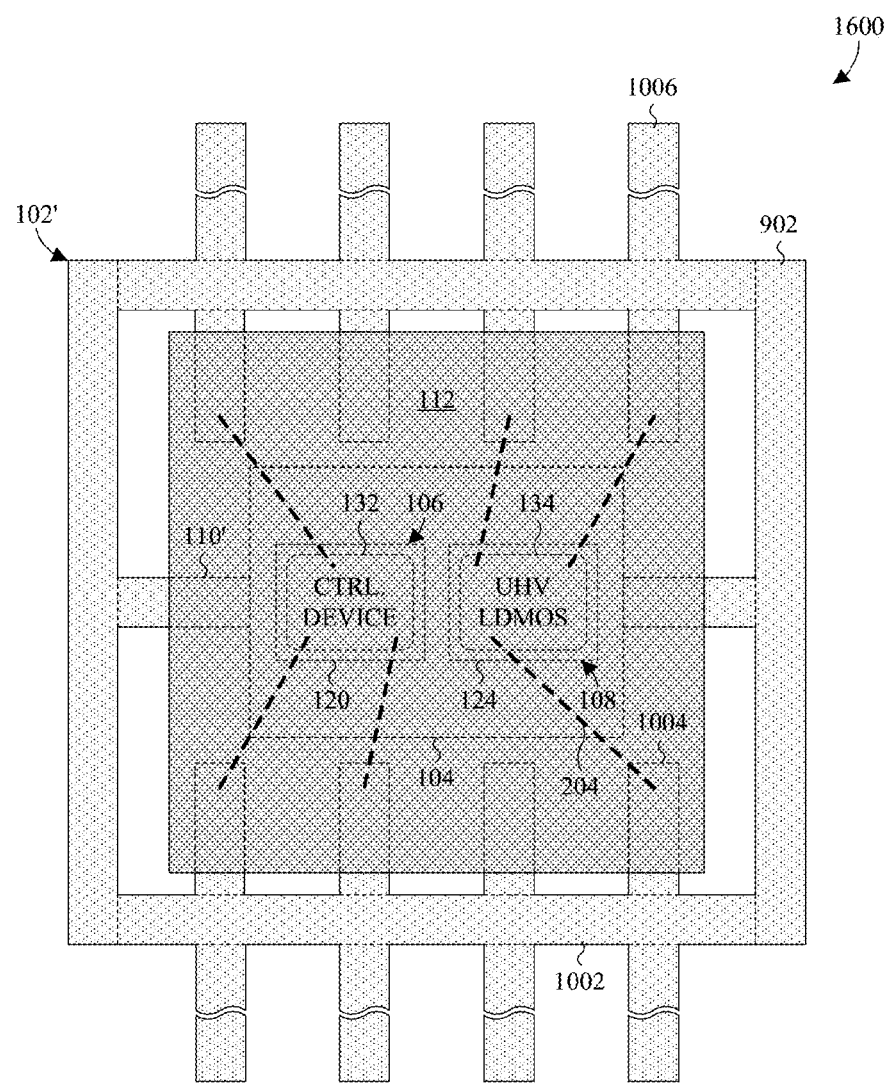

FIG. 16 illustrates a top view 1600 of some embodiments corresponding to Act 812 of FIG. 8. As illustrated, a housing 112 is formed around a die pad 104 of a lead frame 102', at least part of support bars 110' of the lead frame 102' that extend laterally from the die pad 104, first and second chips 106, 108 arranged over and bonded to the die pad 104, at least part of inner leads 1004 of the lead frame 102', and wire bonds 204 extending between the first and second chips 106, 108 to the inner leads 1004. Typically, the housing 112 is formed by molding. In such embodiments, dam bars 1002 of the lead frame 102' and side bars 902 of the lead frame 102' typically stop the molded material from expanding outside a ring-shaped support structure formed by the dam bars 1002 and the side bars 902. This advantageously allows the housing 112 to surround the inner leads 1004 without surrounding outer leads 1006 of the lead frame 102'.

Figure 17:
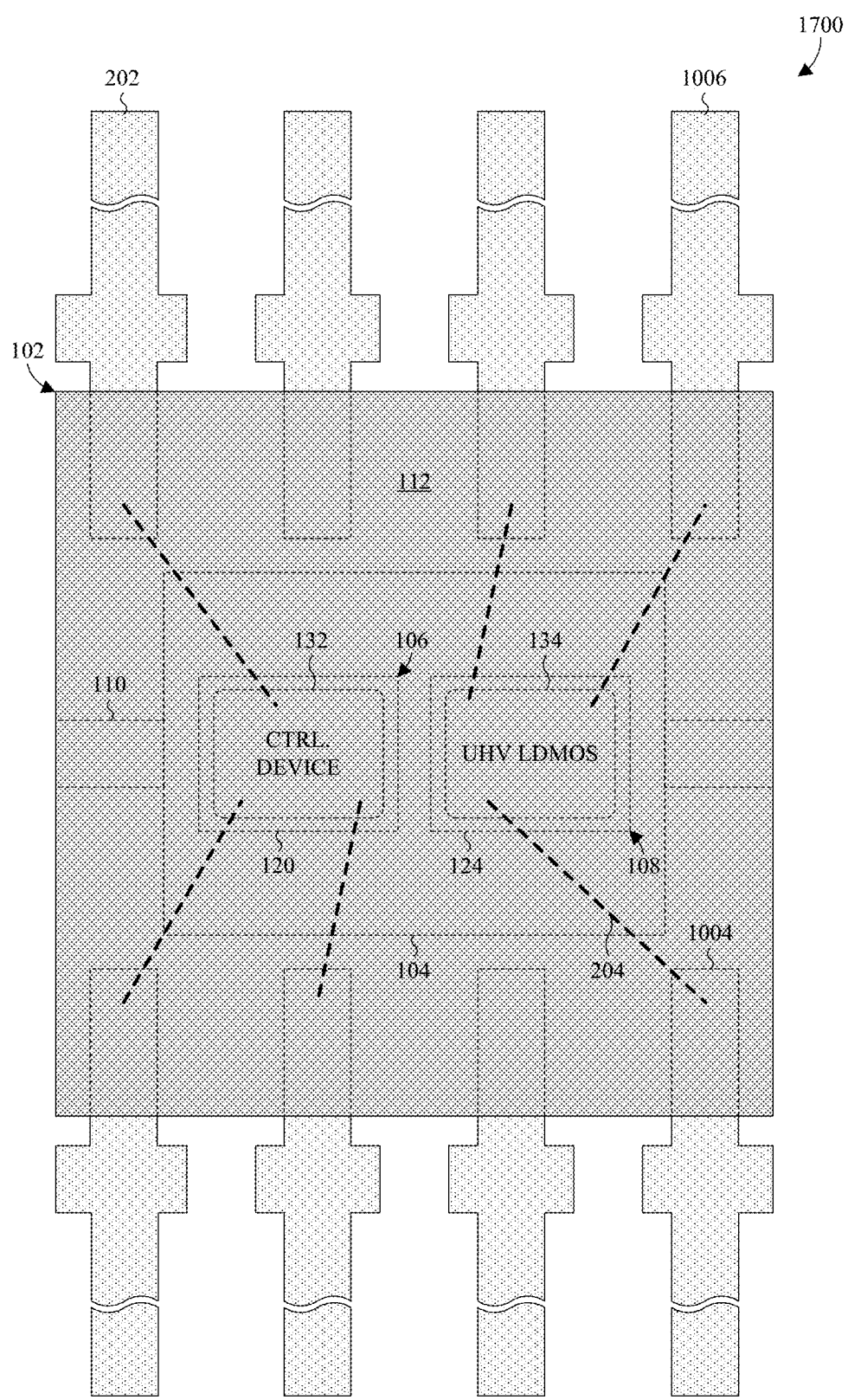

FIG. 17 illustrates a top view 1700 of some embodiments corresponding to Acts 814 and 816 of FIG. 8. As illustrated, side bars 902 of a lead frame 102' that are arranged on first opposing sides of a die pad 104 of the lead frame 102' are removed. In some embodiments, the removal is achieved by running a die saw along the side bars 902. Further, in some embodiments, the removal removes part of support bars 110' extending laterally from the side bars 902 and/or a housing 112 surrounding the die pad 104.

Also illustrated, dam bars 1002 of the lead frame 102' that are arranged on second opposing sides of the die pad 104 are cut between inner and outer leads 1004, 1006 of the lead frame 102' to form composite leads 202 including corresponding inner leads 1004 and corresponding outer leads 1006. Typically, each composite lead 202 includes an inner lead 1004 and an outer lead 1006 corresponding to the inner lead 1004. In some embodiments, the cutting is achieved by running a die saw through the dam bars 1002 between the inner leads 1004 and between the outer leads 1006.

Thus, as can be appreciated from above, the present disclosure provides a semiconductor package. The semiconductor package includes a lead frame with a die pad, and a first chip arranged over and bonded to the die pad. The first chip has a first device with a first operating voltage. The semiconductor package further includes a second chip arranged over and bonded to the die pad spaced from the first chip, and a dielectric layer arranged between the die pad and the second device. The second chip has a second device with a second operating voltage greater than the first operating voltage.

In other embodiments, the present disclosure provides a method for manufacturing a semiconductor package. A lead frame having a die pad is provided. A first chip and a second chip are provided or formed. The first chip includes a first device with a first operating voltage. The second chip includes a second device with a second operating voltage greater than the first operating voltage. The first and second chips are bonded to the die pad with a dielectric layer arranged between the second chip and the die pad, and with the first and second chips spaced from each other.

In yet other embodiments, the present disclosure provides a semiconductor package. The semiconductor package includes a lead frame with a die pad, and a first chip arranged over and bonded to the die pad. The first chip includes a first device with a first operating voltage less than about 10 volts. The semiconductor package further includes a second chip arranged over and bonded to the die pad spaced from the first chip. The second chip includes a MOS device with a second operating voltage greater than about 100 volts. The semiconductor package further yet includes dielectric layer arranged between the die pad and the MOS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a lead frame with a die pad;
a first chip arranged over and bonded to the die pad, wherein the first chip comprises a first device with a first operating voltage, and wherein the first chip further comprises a bulk semiconductor substrate within which the first device is arranged;
a bonding layer arranged between the die pad and the first chip, wherein the bonding layer directly bonds the first chip to the die pad;
a second chip arranged over and bonded to the die pad spaced from the first chip, wherein the second chip comprises a second device with a second operating voltage greater than the first operating voltage;
a dielectric layer arranged between the die pad and the second device, wherein a bottom surface of the dielectric layer is spaced over the die pad by a semiconductor layer, wherein the second chip further comprises a semiconductor-on-insulator (SOI) substrate, wherein the SOI substrate comprises the semiconductor layer and an additional semiconductor layer respectively under and over the dielectric layer, and wherein the second device is arranged in the additional semiconductor layer; and
an additional bonding layer arranged between the die pad and the second chip, wherein the additional bonding layer directly bonds the second chip to the die pad.

2. The semiconductor package according to claim 1, wherein the first device is configured to operate at less than about 10 volts, and wherein the second device is configured to operate at more than about 100 volts.

3. The semiconductor package according to claim 1, wherein the second chip is spaced from the first chip between about one micrometer and about two micrometers.

4. The semiconductor package according to claim 1, wherein the first device is electrically coupled to the lead frame.

5. The semiconductor package according to claim 1, wherein the lead frame includes leads spaced from and extending laterally from the die pad, and wherein the semiconductor package further includes:
  wire bonds electrically coupling the first and second chips to the leads; and
  a housing surrounding the die pad, the first and second chips, and the wire bonds.

6. The semiconductor according to claim 1, wherein the first device comprises a field-effect transistor arranged over the bulk semiconductor substrate, recessed below a top surface of the bulk semiconductor substrate, wherein the second device is a laterally-diffused metal-oxide semiconductor (LDMOS) transistor arranged over the SOI substrate, recessed below a top surface of the additional semiconductor layer, and wherein the second device is the only active device of the second chip.

7. The semiconductor package according to claim 5, wherein the leads extend laterally along a first axis and include lateral protrusions outside the housing, wherein the lead frame further comprises support bars extending laterally along a second axis that is orthogonal to the first axis, and wherein the support bars begin at the die pad and terminate at sidewalls of the housing.

8. A method for manufacturing a semiconductor package, said method comprising:
  providing a lead frame having a die pad;
  forming a first chip and a second chip, the first chip including a first device with a first operating voltage, and the second chip including a second device with a second operating voltage greater than the first operating voltage, wherein the first chip further includes a bulk semiconductor substrate, wherein forming the first chip comprises forming the first device over the bulk semiconductor substrate, partially recessed into the bulk semiconductor substrate, wherein the second chip further includes a semiconductor-on-insulator (SOI) substrate, wherein the SOI substrate includes a dielectric layer, a semiconductor layer under the dielectric layer, and an additional semiconductor layer over the dielectric layer, and wherein forming the second chip comprises forming the second device over the SOI substrate, partially recessed into the additional semiconductor layer; and
  bonding the first and second chips to the die pad with the dielectric layer arranged between the second device and the die pad, and with the first and second chips spaced from each other, wherein the bonding comprises directly bonding the first chip to the die pad through a bonding layer, and further comprises directly bonding the second chip to the die pad through an additional bonding layer.

9. The method according to claim 8, further including:
  forming the second device as a laterally-diffused metal-oxide semiconductor (LDMOS) transistor; and
  forming the first device as an active control device configured to control the second device.

10. The method according to claim 8, further including:
  forming the first device to operate at less than 10 volts; and
  forming the second device to operate at more than 100 volts.

11. The method according to claim 8, further including:
  providing the lead frame with leads;
  forming wire bonds electrically coupling the first and second chips to the leads; and
  forming a housing surrounding the die pad, the first and second chips, and the wire bonds.

12. The method according to claim 8, further comprising:
  forming a housing encapsulating the die pad and the first and second chips; and
  forming solder balls over the housing and the first and second chips, wherein the solder balls are formed electrically coupled to the first and second devices.

13. The method according to claim 12, further comprising:
  flip chip bonding the housing to a substrate through the solder balls.

14. A semiconductor package comprising:
  a lead frame with a die pad;
  a first chip arranged over and bonded to the die pad, wherein the first chip comprises a first device with a first operating voltage less than about 10 volts, wherein the first chip further comprises a bulk semiconductor substrate within which the first device is arranged, and wherein the first device comprises a transistor;
  a bonding layer arranged between the die pad and the first chip, wherein the bonding layer directly bonds the first chip to the die pad;
  a second chip arranged over and bonded to the die pad spaced from the first chip, wherein the second chip comprises a metal-oxide semiconductor (MOS) device with a second operating voltage greater than about 100 volts, and wherein the MOS device is a transistor;
  a dielectric layer arranged between the die pad and the MOS device, wherein the second chip further comprises a semiconductor-on-insulator (SOI) substrate, wherein the SOI substrate comprises a semiconductor layer and an additional semiconductor layer respectively under and over the dielectric layer, and wherein the MOS device is arranged in the additional semiconductor layer; and
  an additional bonding layer arranged between the die pad and the second chip, wherein the additional bonding layer directly bonds the second chip to the die pad.

15. The semiconductor package according to claim 14, wherein the additional bonding layer is laterally spaced from the bonding layer.

16. The semiconductor package according to claim 15, wherein the lead frame includes leads spaced from and extending laterally from proximate the die pad, and wherein the semiconductor package further includes:
  wire bonds electrically coupling the first and second chips to the leads; and
  a housing encapsulating the die pad, the first and second chips, and the wire bonds, such that the leads extend laterally outward from the housing.

17. The semiconductor package according to claim 15, wherein the first chip is electrically coupled to the die pad through the first bonding layer.

18. The semiconductor package according to claim 14, wherein the bonding layer has a top surface and a bottom surface respectively contacting the die pad and the bulk semiconductor substrate.

* * * * *